(12) United States Patent
Kay

(10) Patent No.: US 6,581,278 B2
(45) Date of Patent: Jun. 24, 2003

(54) PROCESS AND SUPPORT CARRIER FOR FLEXIBLE SUBSTRATES

(75) Inventor: Yuen Yew Kay, Singapore (SG)

(73) Assignee: St Assembly Test Service Ltd., Singapore (SG)

( * ) Notice: Subject to any disclaimer, the term of this patent is extended or adjusted under 35 U.S.C. 154(b) by 230 days.

(21) Appl. No.: 09/759,904

(22) Filed: Jan. 16, 2001

(65) Prior Publication Data

US 2002/0093080 A1 Jul. 18, 2002

(51) Int. Cl.[7] .............................. H05K 3/36; H05K 5/06
(52) U.S. Cl. ............................ 29/830; 29/829; 29/832; 29/825; 174/52.2; 174/52.4; 257/787; 257/788; 257/678
(58) Field of Search ........................ 29/830, 832, 829, 29/827, 825, 740, 25.01; 174/52.2, 52.4; 324/755; 257/675, 787, 788; 361/707, 808; 438/111, 122, 458

(56) References Cited

U.S. PATENT DOCUMENTS

| | | | |
|---|---|---|---|
| 3,795,043 A | * 3/1974 | Forlani | 29/574 |
| 4,480,975 A | * 11/1984 | Plummer et al. | 425/116 |
| 4,746,548 A | * 5/1988 | Boudreau et al. | 427/248.1 |
| 4,915,057 A | 4/1990 | Boudreau et al. | 118/505 |
| 5,751,556 A | * 5/1998 | Butler et al. | 174/52.2 |
| 5,828,224 A | * 10/1998 | Maruyama | 324/755 |
| 5,854,741 A | * 12/1998 | Shim et al. | 361/813 |
| 6,037,026 A | 3/2000 | Iwamoto | 428/40 |
| 6,111,324 A | * 8/2000 | Sheppard et al. | 257/787 |
| 2002/0090749 A1 | * 7/2002 | Simmons | 438/64 |
| 2002/0093080 A1 | * 7/2002 | Kay | 257/678 |

* cited by examiner

Primary Examiner—Carl J. Arbes
Assistant Examiner—Minh Trinh
(74) Attorney, Agent, or Firm—George O. Saile; Stephen B. Ackerman

(57) ABSTRACT

A substrate carrier which is used through beginning assembly operations such as solder reflow for attaching ball grid array devices to flexible substrates. The carrier includes a main structural support for centerly placing the substrate. The support member include two pairs of pins protruding from the support member to engage with a matching pair of datum apertures disposed inboard of the side edges of the substrate. A plurality of high temperature magnetic inserts are affixed into holes of the support member disposed parallel and outboard of the pins. The cover has two rows of apertures for engagement with the pins of the support member is attracted by the magnetic inserts forcing the outer periphery of the cover against the top surface of the substrate.

16 Claims, 4 Drawing Sheets

FIG. 1 – Prior Art

PROCESS AND SUPPORT CARRIER FOR FLEXIBLE SUBSTRATES

BACKGROUND OF THE INVENTION (1) Technical Field

This invention relates to the general field of semiconductor devices, and more particularly, to a method for handling small thin plastic ball grid array substrates (STPBGA), in preparation for front-of-line assembly operations.

(2) Description of the Prior Art

The following documents relate to methods dealing with handling of thin substrates during processing.

U.S. Pat. No. 4,915,057 issued Apr. 10, 1990 to Boudreau et al., shows methods and apparatus for registration or alignment of thin film structure patterns on a substrate formed with the use of an apertured mask in a vacuum deposition system.

U.S. Pat. No. 6,037,026 issued Mar. 14, 2000 to Iwamoto discloses a substrate carrier jig which supports a substrate of a liquid crystal display element on its surface and carries the substrate with the jig to a process.

The conductors used for interconnection within a semiconductor chip are extremely fine, being of the order of a few microns, or less, in width. The ability to construct such tiny conductors has made possible chips containing four to five orders of magnitude, and more, of interconnected components. This high level of integration has presented an enormous challenge in assembly during the front-of-line die-attach operations, which include, solder reflow or epoxy attach, plasma cleaning, plastic underfilling, curing of the underfilling, and removal of the substrate carrier.

There are several other types of package technologies that include such rigid substrates as ceramics with straight-through vias, flexible polymer tape in tape automated bonding (TAB) with bumps or balls on either end, also, wafer-level assembly such as redistribution of peripheral I/Os to area array I/Os on chip and lead-on-chip(LOC).

Interconnections at the chip level were and are being achieved by wire bonding to plastic or ceramic single chip packages which are then bonded to printed wiring boards using surface mount technology (SMT). The trend is toward Flip Chip and Ball Grid Array (BGA), and to direct-chip attach to the board.

The packaging technologies that span the microelectronics industry from consumer electronics to low-end systems to high-performance systems are very diverse. The number of chips needed to form a system in the past increased from a few, in consumer electronics, to several thousands, in supercomputers. Given this, the viable carriers which are used to handle BGA devices are becoming equally diverse and more complex, especially for the front-of-line assembly operations.

The development cycle for first level packaging is extremely time consuming and costly. When the technology itself is developing in parallel, but on different time scales, resolution of the problems does not become easier. All of these issues are exacerbated by the continuing advance of VLSI and ultra large-scale integration (VLSI) technology, where exponential increases in the number of conductors are matched by its interconnected components.

An improvement in packaging efficiency for ball grid arrays (BGAs) is being achieved by a so-called small thin plastic ball grid array (STPBGA) substrate, a fire retardant synthetic resin/glass cloth laminate, typically 0.2 mm thick.

However, there are many problems encountered in the processing of these very thin, and flimsy STPBGA substrates. Bending under the slightest influence of force is one of the problems, and warping during solder reflow causing the $C_4$ balls of the chip to be pushed away from the distorted substrate especially when passing through the reflow oven at temperatures above 200° C. Because of the fast moving advancements in packaging technology, prior art availability of carriers to solve the above problems were non-existing. A type of process carrier used during product development is described with reference to FIG. 1. The process carrier 10 used during the development cycle was simply a flat support plate 18 having pins 11 for guiding the substrate 30, and a top weighted means 12 to hold the substrate down against the carrier. The weighted mass was needed to affect the required clamping force thus preventing substrate distortions during solder reflow which lengthened the reflow cycle as compared to a thicker more solidly stable substrate. Reprofiling the oven zone temperatures and slowing the conveyor speed was needed because of the added thermal mass passing through the oven.

SUMMARY OF THE INVENTION

The present invention has been accomplished in view of the above mentioned conventional problems and is an object of the present invention to provide a substrate process carrier to eliminate the problems encountered in the processing of these very flexible substrates which include the group of thin STPBGA substrates, thick STPBGA substrates and flexible tape. Bending under the slightest influence of force, and warping during solder reflow causing the $C_4$ balls of the chip to be pushed away from the distorted substrate especially when passing through the reflow oven at temperatures above 200° C. has been eliminated. Prior process carriers using a top weighted plate to effect the required clamping force during solder reflow, lengthening the solder reflow cycle because of the added thermal mass of the weighted plate, is no longer needed.

Another object of the invention has been to provide a substrate carrier for flexible substrates having a low thermal mass for improved temperature profiling.

According to the present invention, the substrate carrier holds a flexible substrate during many of the early assembly operations such as; die attach, solder reflow, plasma cleaning, underfilling of plastic, curing the underfilling, as well as wirebond, lead bond and TAB bond, etc. The carrier includes a main structural support member having a first surface for placing thereon a substrate wherein the support member has two rows of pins which are positioned longitudinally and fitly into datum apertures disposed inboard the side edges of the substrate. The two rows of apertures in the substrate accurately locate the substrate on the first surface of the substrate carrier. A plurality of high temperature magnetic inserts, which retain appreciable magnetization indefinitely, are affixed to the first surface of the support member and disposed parallel and outboard the two rows of pins. A hold down cover, selected from a group consisting of magnetically soft metals, is placed over the substrate. The hold down cover has openings extending laterally and longitudinally to bare the conductive patterns of the substrate and has two rows of apertures matching the two rows of apertures in the substrate, the cover, also fitly into the two rows of pins of the support member, is aligned relative the substrate, and pulled against the thin substrate by the magnets, thereby, pressing the outer periphery of the thin substrate against the first surface of the support member

DETAILED DESCRIPTION OF THE PREFERRED EMBODIMENT

The present invention has been accomplished in view of the aforementioned conventional problems and is an object of the present invention to provide a substrate process carrier to eliminate the problems encountered in the processing of flexible substrates which include the very thin, and flimsy STPBGA substrates as well as thick STPBGA substrates and flexible tape substrates. Bending under the slightest influence of force, and warping at temperatures above 200° C. during solder reflow, cause the $C_4$ balls of the chip to be pushed away from the distorted substrate particularly when passing through the reflow oven. Prior process carriers using a top weighted plate, to effect the required clamping force have been eliminated. The carriers lengthened the solder reflow cycle because of the increased thermal mass presented by the weighted plate.

Figure 1:
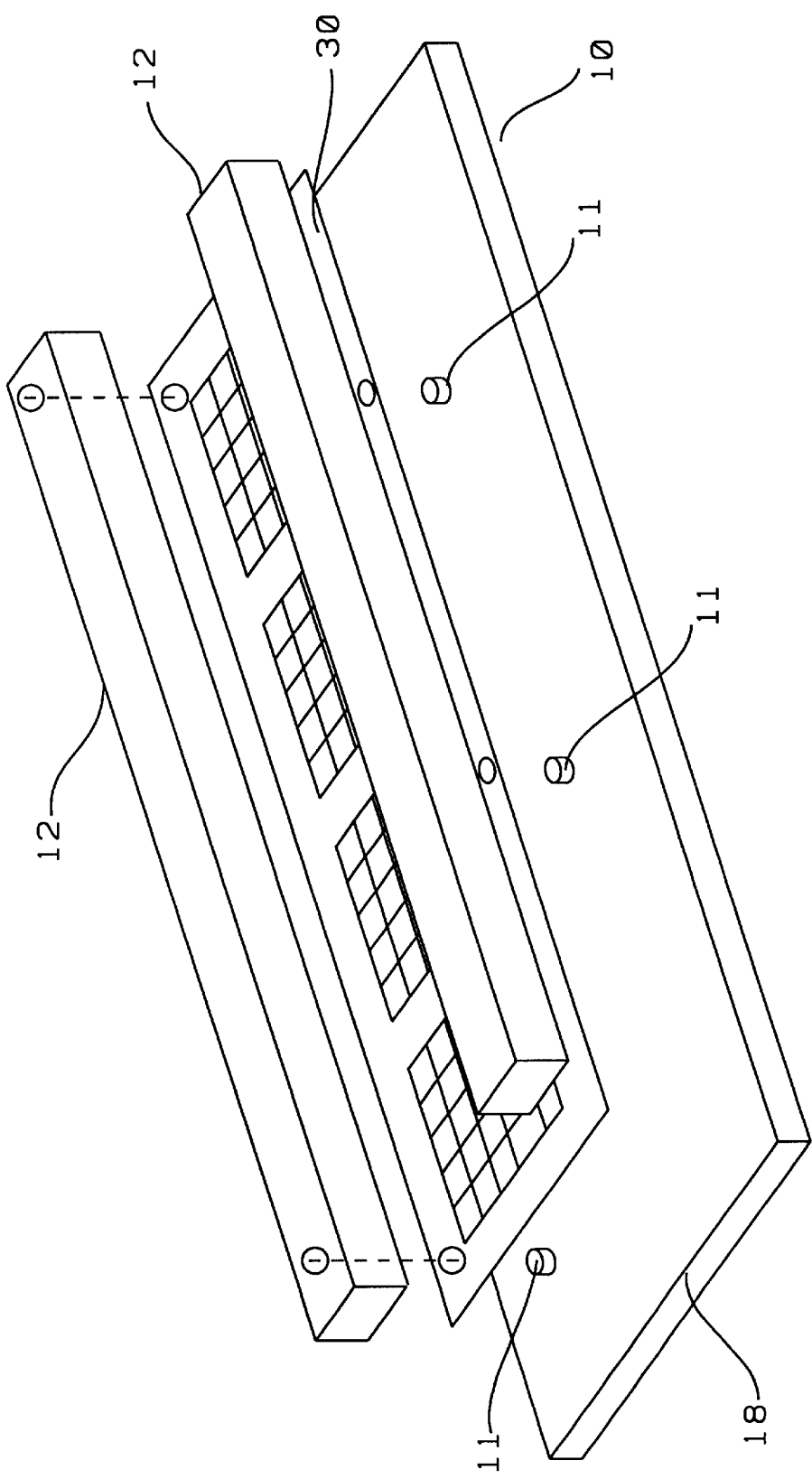
FIG. 1 is an exploded, perspective view of the flexible substrate carrier of the prior art.

As previously described with FIG. 1 illustrating the type of prior process carrier used during the STPBGA development phase, demonstrates how a flat support plate with pins for guiding the substrate and a top weighted plate to hold the substrate down against the carrier was implemented. The weighted mass was needed to effect the required clamping force for preventing substrate distortions during solder reflow. The added mass lengthened the reflow cycle as compared to a thicker unclamped substrate. A longer solder reflow time was needed because of having to reduce the oven conveyor speed because of the added thermal mass.

Figure 2:
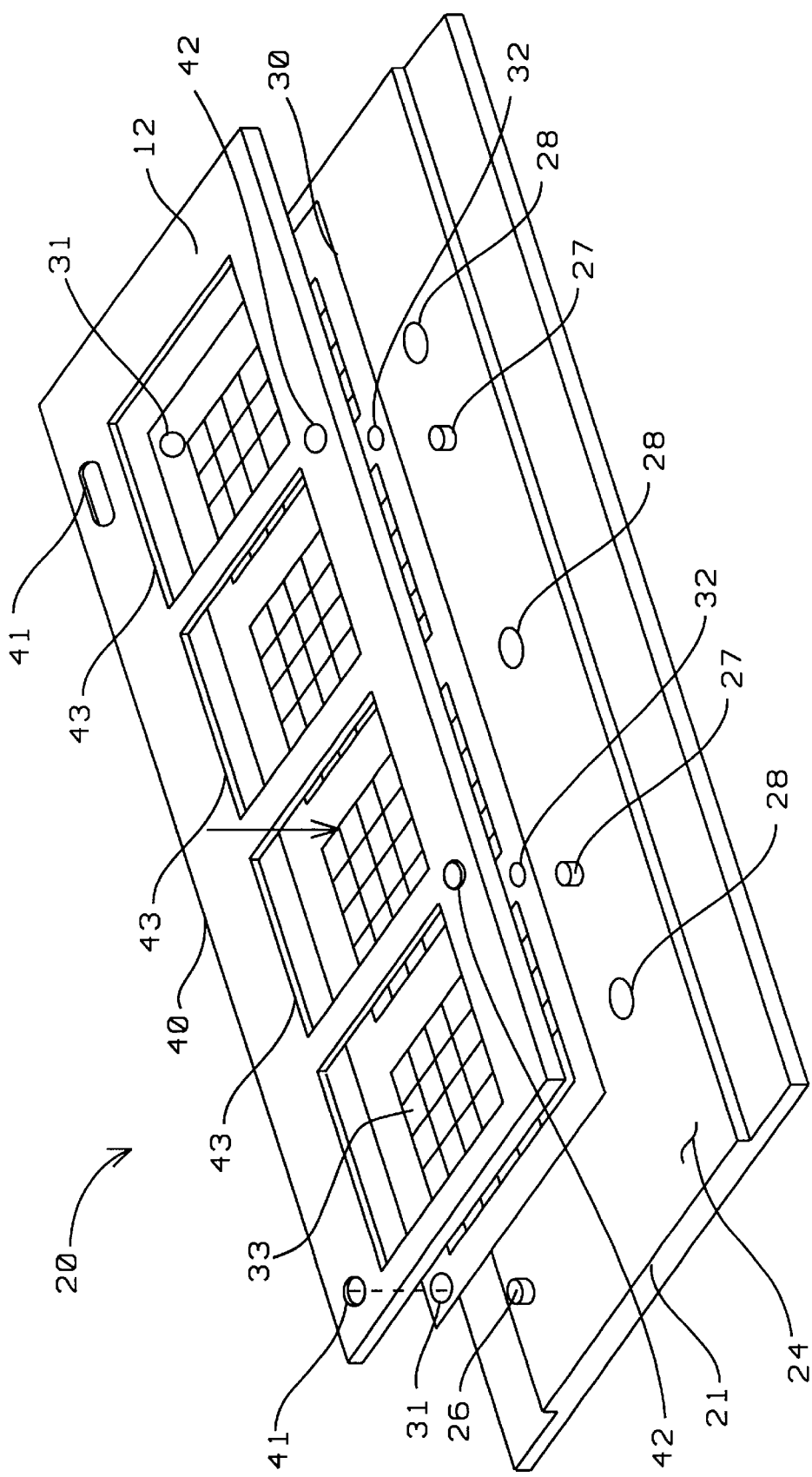
FIG. 2 is an exploded, perspective view of the flexible substrate carrier with a cover having a plurality of openings according to the invention.

Referring now to FIG. 2 an exploded perspective view of a substrate carrier 20 which is used through beginning assembly operations while holding either a thin flexible STPBGA substrate 30, a thick STPBGA substrate, or a flexible tape. A main structural support member 21 having a first surface 24 for centerly placing the substrate 30 thereon, the support member includes two pairs of pins 25, 26 protruding up from the first surface, a first pair 26 disposed towards one side of the support member and a second pair 27 disposed towards the other side The pins are spaced longitudinally in pairs to engage with a matching pair of datum apertures 31, 32 disposed inboard of side edges of the substrate. A plurality of high temperature magnetic inserts 28 are affixed into holes in the first surface of the support member 21, are disposed parallel and outboard of the pins 26, 27. These magnets must have high residual induction to sustain magnetism during the solder reflow process with reflow temperatures above 200° C.

A cover 40 for placing over and pressing against the top surface of the substrate 30, has two rows of apertures 41, 42 for engaging the pins 26, 27 of the support member and aligning it with the substrate. The apertures are arranged semikinematically to allow for expansion during solder reflow. The apertures near one end of the cover are round and at the other end elongated in the longitudinal direction. The cover includes a plurality of openings 43 extending laterally and longitudinally to bare conductive patterns 33 on the top surface of the substrate 30 when the substrate is in place. The cover 40 is made from a low hysteresis, magnetically soft metal selected from the group consisting of silicon-iron, carbon iron, nickel iron, and cobalt-iron and is magnetically attracted to the magnetic inserts 28 in support member 21 after engagement with the pins 26, 27. The cover is structurely formed to maintain planarity, makes contact and presses the outer periphery of the top surface of the substrate, thereby, securing the flatness integrity throughout the "front of line" assembly operations.

Figure 3:
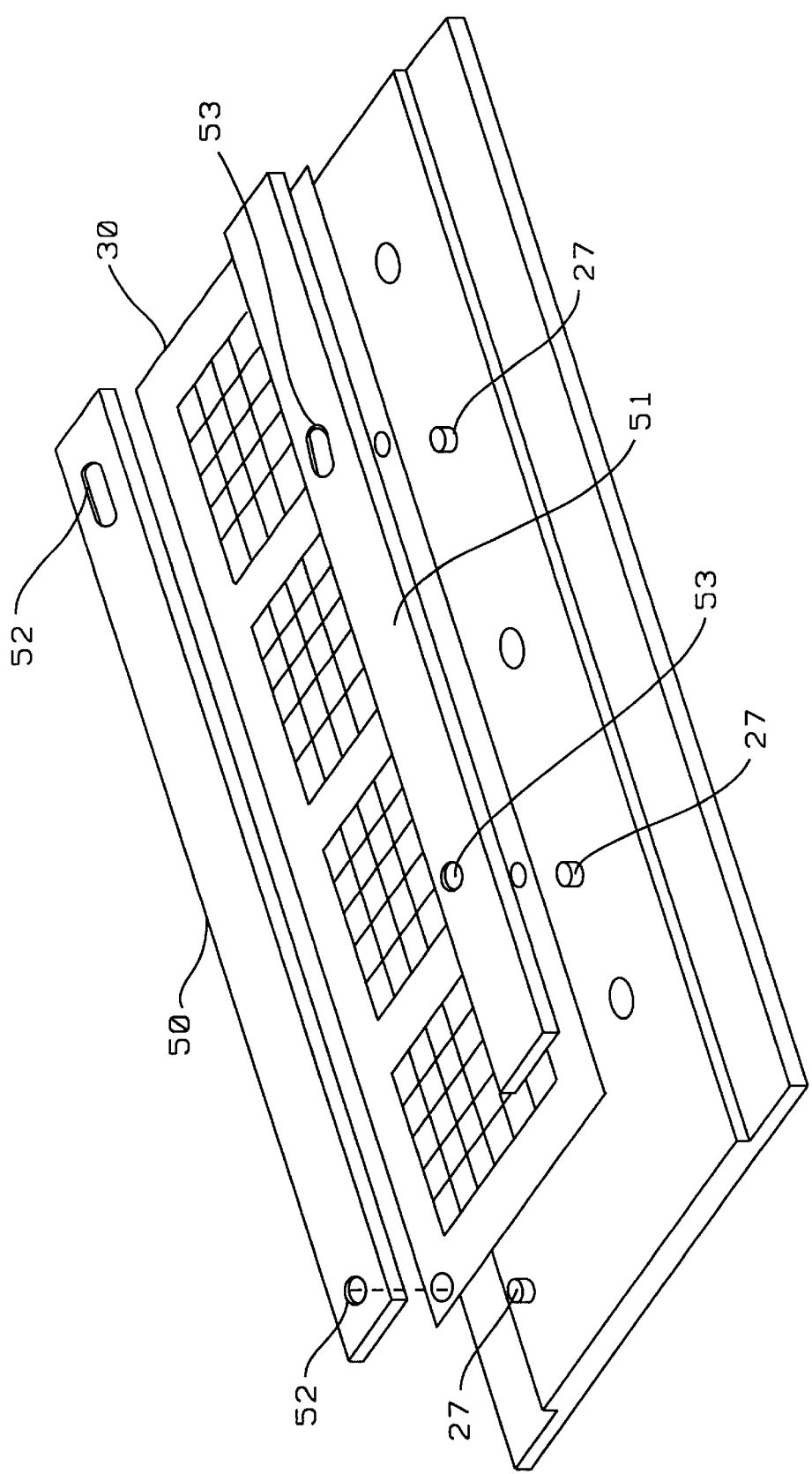
FIG. 3 is an exploded, perspective view of a flexible substrate carrier with a two piece side rail cover according to the invention.

FIG. 3 showing a two piece side rail covers 50, 51 for placing over and pressing against the top outside side edges of the substrate 30, each rail member has a pair of apertures 52, 53 for engaging the pins 27 of the support member and aligning it with the substrate 30. The apertures 52, 53 are arranged semikinematically to allow for expansion during solder reflow. The apertures near one end of the cover are round and at the other end elongated in the longitudinal direction. The rail covers 50, 51 are made from a low hysteresis, magnetically soft metal selected from the group consisting of silicon-iron, carbon iron, nickel iron, and cobalt-iron and is magnetically attracted to the support member after engagement with the pins. The rail covers are structurely formed to maintain planarity, makes contact and presses the outer periphery of the top surface of the substrate, thereby, securing the flatness integrity throughout the "front of line" assembly operations.

Figure 4:
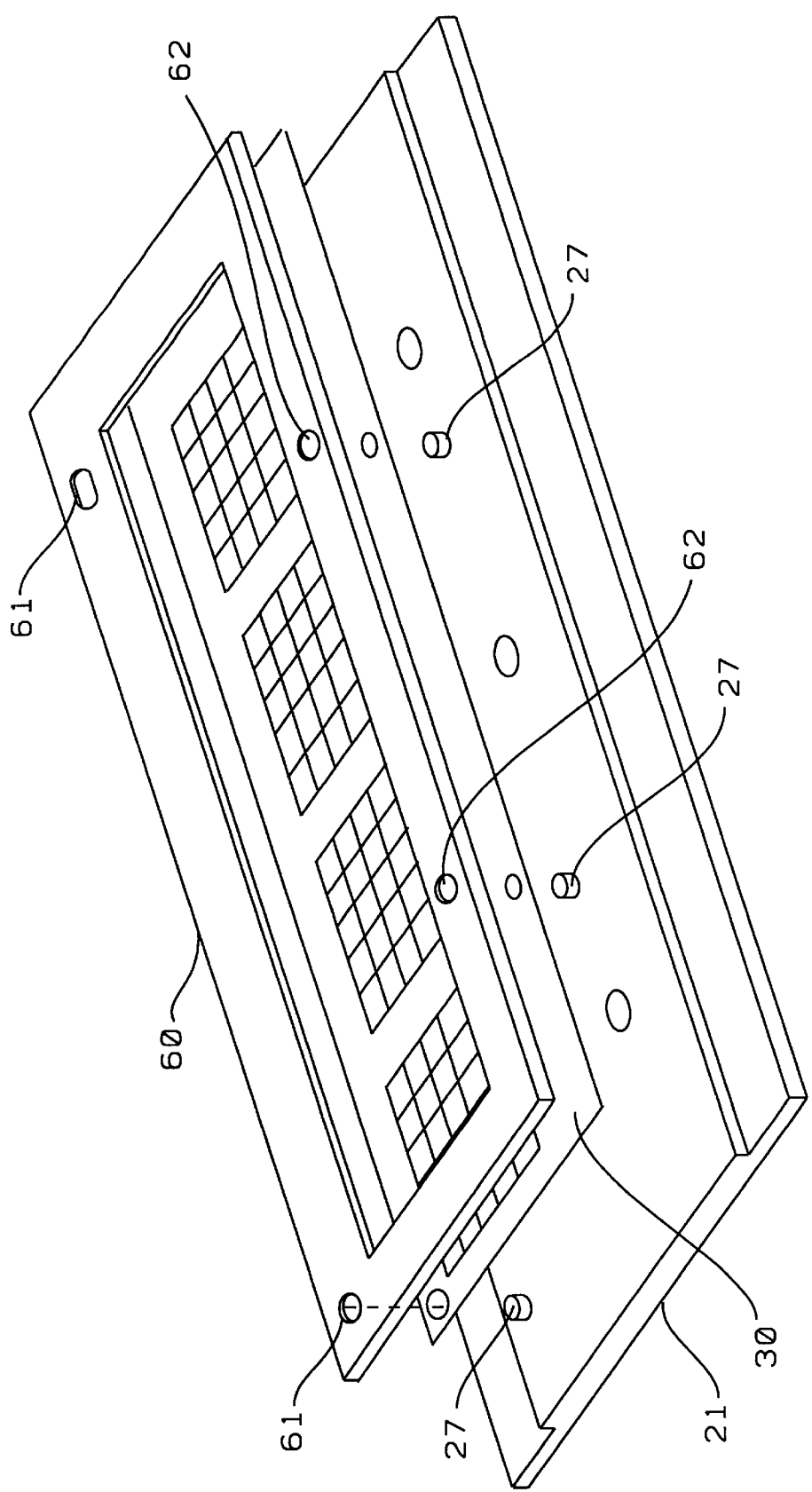
FIG. 4 is an exploded, perspective view of a flexible substrate carrier with a peripheral cover according to the invention.

FIG. 4 illustrates an outer periphery cover 60 for placing over and pressing against the top outside edges of the substrate 30, the longer side members having a pair of apertures 61, 62 for engaging the pins 27 of a support member 21 and aligning it with the substrate. This outer periphery cover has all the functional attributes as those described in FIGS. 2 and 3.

While the invention has been particularly shown and described with reference to the preferred embodiments thereof, it will be understood by those skilled in the art that various changes in form and details may be made without departing from the spirit and scope of the invention.

What is claimed is:

1. A substrate support carrier which is used through beginning assembly operations while holding flexible substrates, comprising:

a main structural support member having a first surface for centerly supporting a substrate thereon, said support member including two pairs of pins protruding from said first surface, a first pair disposed towards one end of said support member and a second pair disposed towards the other end, said pins are spaced laterally in pairs to engage with a matching pair of datum apertures disposed inboard of side edges of said substrate;

a plurality of high temperature magnetic inserts affixed into holes of said first surface of said support member, said magnets disposed parallel and outboard of said of pins;

a cover for placing over and semikinematically pressing against top surface of said substrate, said cover having two rows of apertures for engagement with said pins of said support member.

2. The substrate support carrier according to claim 1 wherein said flexible substrates is selected from the group consisting of thin small thin plastic ball grid array substrates, thicker small thin plastic ball grid array substrates, and flexible tape.

3. The substrate support carrier according to claim 1 wherein the beginning assembly operations include:

die attach, solder reflow, plasma cleaning, die underfilling with a plastic, curing plastic underfilling, wirebonding, lead bonding, and tape automated bonding.

4. The substrate support carrier according to claim 1 wherein engagement of said cover with pins of said support member aligns said cover with said substrate.

5. The substrate support carrier according to claim 1 wherein said cover includes openings extending laterally and longitudinally to bare conductive patterns on top surface of substrate.

6. The substrate support carrier according to claim 1 wherein said cover is made from a magnetically soft metal selected from the group consisting of silicon-iron, carbon iron, nickel iron, and cobalt-iron.

7. The substrate support carrier according to claim 1 wherein said cover is magnetically attracted to said support member after engagement with said pins, said cover only pressing the outer periphery of said top surface of substrate.

8. The substrate support carrier according to claim 1 wherein said two rows of apertures on said cover are arranged semikinematically to allow for thermal expansion during solder reflow, said apertures near one end of said cover are round, apertures at the other end are elongated in a longitudinal direction.

9. A method of producing a substrate support carrier which is used through beginning assembly operations while holding a flexible substrate, comprising the steps of:

providing a flexible substrate;

providing a main structural support member having a first surface for centerly placing a substrate thereon, said support member including two pairs of pins protruding from said first surface, a first pair disposed towards one end of said support member and a second pair disposed towards the other end, said pins are spaced laterally in pairs to engage with a matching pair of datum apertures disposed inboard of side edges of said substrate, said support member having a plurality of high temperature magnetic inserts affixed into holes of said first surface of said support member, said magnets disposed parallel and outboard of said of pins, and providing a cover for placing over and semikinematically pressing against top surface of said substrate, said cover having two rows of apertures for engagement with said pins of said support member.

10. The method of producing a substrate support carrier according to claim 9 wherein said flexible substrate is selected from the group consisting of thin small thin plastic ball grid array substrates, thicker small thin plastic ball grid array substrates, and flexible tape.

11. The method of producing a substrate support carrier according to claim 9 wherein the beginning assembly operations include:

die attach, solder reflow, plasma cleaning, die underfilling with a plastic, curing plastic underfilling, wire bonding, and tape automated bonding.

12. The method of producing a substrate support carrier according to claim 9 wherein engagement of said cover with pins of said support member aligns said cover with said substrate.

13. The method of producing a substrate support carrier according to claim 9 wherein said cover includes openings extending laterally and longitudinally to bare conductive patterns on top surface of substrate.

14. The method of producing a substrate support carrier according to claim 9 wherein said cover is made from a magnetically soft metal selected from the group consisting of silicon-iron, carbon iron, nickel iron, and cobalt-iron.

15. The method of producing a substrate support carrier according to claim 9 wherein said cover is magnetically attracted to said support member after engagement with said pins, said cover only pressing the outer periphery of said top surface of substrate.

16. The method of producing a substrate support carrier according to claim 9 wherein said two rows of apertures on said cover are arranged semikinematically to allow for thermal expansion during solder reflow, said apertures near one end of said cover are round, apertures at the other end are elongated longitudinally.

* * * * *

UNITED STATES PATENT AND TRADEMARK OFFICE
CERTIFICATE OF CORRECTION

PATENT NO.       : 6,581,278 B2  
APPLICATION NO.  : 09/759904  
DATED            : June 24, 2003  
INVENTOR(S)      : Yuen Page 1 of 1

It is certified that error appears in the above-identified patent and that said Letters Patent is hereby corrected as shown below:

Title page of Patent, Inventor (75), delete "Yuen Yew Kay" and insert therefor --Yew Kay Yuen--

Signed and Sealed this

Fifteenth Day of August, 2006

JON W. DUDAS  
*Director of the United States Patent and Trademark Office*